United States Patent
Bookwalter et al.

(10) Patent No.: US 8,030,921 B2
(45) Date of Patent: *Oct. 4, 2011

(54) METHODS FOR FAT SIGNAL SUPPRESSION IN MAGNETIC RESONANCE IMAGING

(75) Inventors: Candice A. Bookwalter, University Heights, OH (US); Jeffrey L Sunshine, Pepper Pike, OH (US); Jeffrey L Duerk, Avon Lake, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/624,860

(22) Filed: Nov. 24, 2009

(65) Prior Publication Data

US 2010/0066365 A1    Mar. 18, 2010

Related U.S. Application Data

(63) Continuation of application No. 12/044,442, filed on Mar. 7, 2008, now Pat. No. 7,646,198.

(60) Provisional application No. 60/894,070, filed on Mar. 9, 2007.

(51) Int. Cl.
*G01V 3/00*    (2006.01)

(52) U.S. Cl. ...................................................... 324/307

(58) Field of Classification Search .......... 324/300–322; 600/410–435
See application file for complete search history.

(56) References Cited

U.S. PATENT DOCUMENTS 7,646,198 B2 *    1/2010    Bookwalter et al. .......... 324/307

* cited by examiner

*Primary Examiner* — Dixomara Vargas
(74) *Attorney, Agent, or Firm* — Kraguljac & Kalnay, LLC

(57) ABSTRACT

This application is directed to methods for chemical species signal suppression in magnetic resonance imaging procedures, where Dixon techniques are enhanced by continuously sampling techniques. K-space data is acquired during a period of read gradient associated with a gradient echo pulse acquisition scheme. A total sampling time (TST) acquisition is employed during the read gradient, using three echoes of a TST data set to achieve chemical species separation in both homogeneous fields as well as areas of field inhomogeneity.

21 Claims, 5 Drawing Sheets

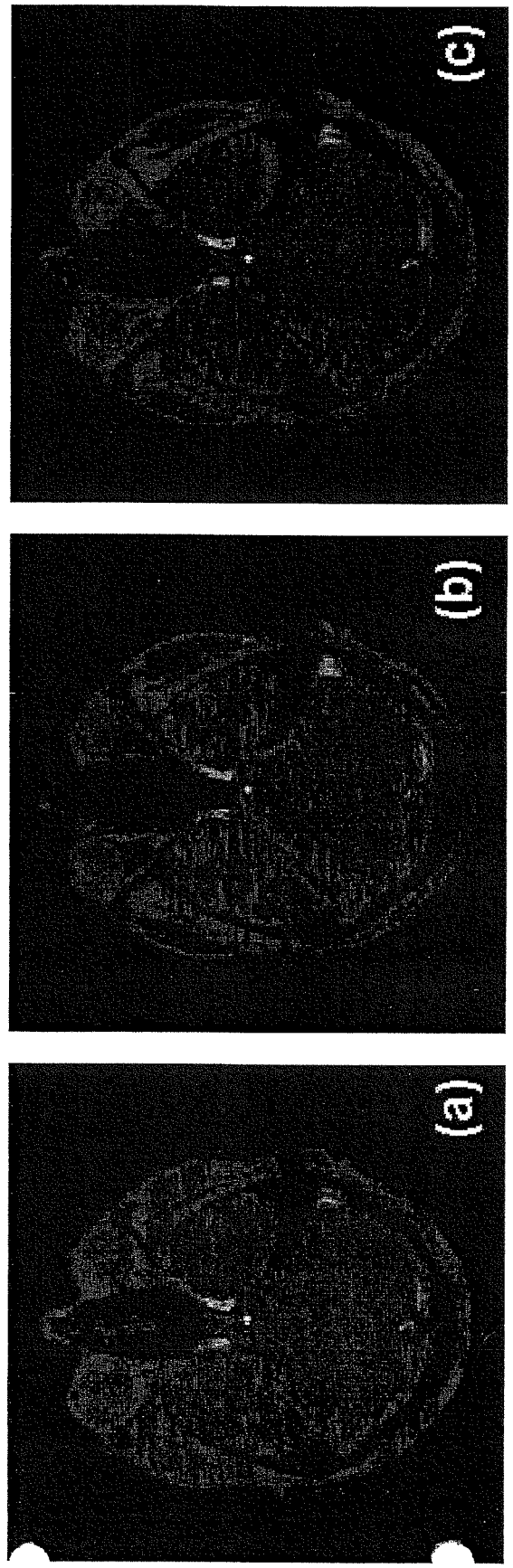

METHODS FOR FAT SIGNAL SUPPRESSION IN MAGNETIC RESONANCE IMAGING

CROSS-REFERENCE TO RELATED APPLICATIONS

This U.S. Continuation Patent Application claims priority to and the benefit of U.S. patent application Ser. No. 12/044,442 filed Mar. 7, 2008, which claims priority to and the benefit of U.S. Provisional Patent Application Ser. No. 60/894,070 filed Mar. 9, 2007, which is incorporated herein by reference in its entirety.

FIELD OF THE INVENTION

The present invention relates to a method of fat signal suppression or separation of fat and water signals in MRI imaging of a scanned object region using rectilinear Dixon techniques.

BACKGROUND OF THE INVENTION

In MRI imaging of chemical species such as fat and water within body tissue, the misregistration of fat in acquired magnetic resonance images can seriously degrade the quality of the image and obscure important pathology. As a diagnostic tool, such off-resonance effects, which may arise from field inhomogeneities, susceptibility or chemical shift, cause artifacts in the acquired images. The artifacts appear as positional shifts along the read direction in rectilinearly sampled acquisitions. Although various fat suppression methods have been conceived, such as using specialized radio-frequency (RF) excitation pulse sequences, such methods have various limitations. For example, inversion recovery pulse sequences and chemical shift selective excitation pulses have been attempted, but are limited by extended acquisition times and specific absorption rate (SAR) constraints when used as a diagnostic tool for human patients.

There have been various attempts at reducing scan times in obtaining reconstructed images of water-fat decomposition, but there is a further need for short scan times while obtaining high quality images. Dixon techniques have been utilized for water-fat decomposition in rectilinear sampling schemes. In a Dixon technique, water and fat images are generated by either addition or subtraction of the "in-phase" and "out-of-phase" data sets. With magnetic field inhomogeneity, such techniques may still lead to inaccurate decomposition of water and fat signals, resulting in a blurred image. In a two-point Dixon (2PD) technique, the two acquired images can be contaminated by off-resonance effects such that the water and fat images have significant components from the unwanted chemical species.

Modified Dixon techniques, such as the three-point Dixon (3PD) technique have also been developed to correct for magnetic field inhomogeneity off-resonance effects as well as susceptibility effects. The advantage of these multiple-point Dixon techniques over specialized RF excitation pulse-sequences or pulses lies in, the ability to acquire water-fat separation even in the presence of magnetic field inhomogeneities, such as tissue-induced local inhomogeneity or applied magnetic field inhomogeneities in the field of view.

Although the multi-point Dixon techniques avoid SAR limitations, the typical Dixon implementation requires two acquisitions with different TE's to create a frequency map for off-resonance corrections. As an example, two acquisitions with different TE's are utilized where the $\Delta TE = 2.2$ MSEC @ 1.5 T. This characteristic $\Delta TE$ generates two complex data sets with 180° relative phase variation in the fat magnetization. The long acquisition times required for two separate acquisitions impose a significant limitation on the use of such techniques. It would therefore be desirable to increase the efficiency of the Dixon technique to reduce acquisition time required for accurate fat-water separation.

SUMMARY OF THE INVENTION

The present invention is therefore directed to methods for fat signal suppression in magnetic resonance imaging procedures, wherein Dixon techniques are enhanced by continuously sampling during the entire period of read gradient. The invention utilizes a total sampling time (TST) acquisition during the entire read gradient, using three echoes of a TST data set to achieve fat-water separation in both homogenous fields as well as areas of field inhomogeneity. In an embodiment, a continuously sampled rectilinearly FLASH pulse sequence is modified such that the time between echoes was configured to be 2.2 milliseconds, with TE selected to allow 180° phase variation in the fat magnetization between each of the three TE's (TE1, TE2, and TE3). Any gradient echo sequence (FLASH, true-FISP, FISP, or other gradient echo sequences) are contemplated. Data collected during the dephase and rephase gradient lobes are defined as a first Dixon acquisition, with data collected by the read gradient lobe being defined as a second Dixon acquisition. Water and fat images are obtained according to the invention, and off-resonance correction is applied if desired.

More particularly, the systems and methods according to the present invention, in an embodiment, provide for constructing an image from an MRI data set, wherein the MRI data is acquired with a total sampling time (TST) acquisition, with a predetermined timing relationship between echoes during a single acquisition process. Accordingly, the present invention provides significant improvement over traditional 2-point Dixon methods in terms of time savings in data acquisition, while providing desired suppression of fat or water signals. The total acquisition time is significantly reduced as compared to traditional 2-point Dixon methods in comparable sequences. These objectives may be realized using an apparatus to produce MRI images of a scanned object region with suppression of fat signals to produce high contrast water and fat images of the scanned object region. The apparatus may comprise a MRI scanner for obtaining images of a predetermined volume of a scanned object region, and a controller configured to control operation of the scanner to acquire images using a modified Dixon technique wherein data acquisition is performed over substantially the entire read gradient of a gradient echo pulse sequence performed on the scanner. The pulse sequence produces data acquired to form a plurality of magnetic resonance imaging data signals which are processed using Dixon reconstruction techniques to create water and fat images of the scanned object region. An output device for display of the formed images.

The invention is also directed to a method for producing chemical species images, such as water/fat images, of a scanned object region with suppression of the respective water and fat signals in alternative images. The method comprises the steps of acquiring k-space data over substantially the entire read gradient of a gradient echo pulse sequence having a dephase lobe, a readout lobe and a rephase lobe. The method combines k-space data from the dephase and rephase lobes of the read gradient to form a first Dixon acquisition and the data acquired from the readout lobe is used to form a second Dixon acquisition. These first and second Dixon acquisitions are used in association with a Dixon reconstruction technique to form water and fat images of the scanned object region.

The system for acquiring the MRI data according to the invention may use any suitable MRI machine capable of constructing an image from the MRI data sets acquired. Such machines may be MRI machines programmed to execute a series of instructions for performing the methods described herein. Such an MRI machine may comprise a field controller for generating a magnetic field around a specimen or desired specimen space, a data acquisition mechanism for acquiring the MRI data set using a total sampling time (TST) acquisition, a processor for determining respective pixels in an image being constructed, and other possible elements such as a frequency parameter representative of a measure of off-resonance signals for voxels associated with respective pixels, a processor for processing as a function of the frequency parameter, for off-resonance correction or a processor for performing other image correction techniques. These and other objects of the invention will be, apparent upon reading of the description of embodiments thereof.

BRIEF DESCRIPTION OF THE DRAWINGS

The present invention may be better understood along with its objects and advantages, with reference to the accompanying drawing.

FIGS. 4A-4C are in-vivo head images, with FIG. 4A showing a traditional image without suppression as reference, FIG. 4B showing an MRI image acquired using a traditional 2-point, 2-acquisition Dixon process, and 4C being an MRI image formed according to an embodiment of the method according to the invention.

DETAILED DESCRIPTION OF THE INVENTION

The systems and methods according to the present invention provide for improvement over traditional 2-point Dixon techniques for application to rectilinear imaging techniques with improved speed and quality. In conjunction with the fat-water separation provided by Dixon techniques, the present invention provides for increased acquisition speed to facilitate use in a variety of situations and environments.

Figure 1:
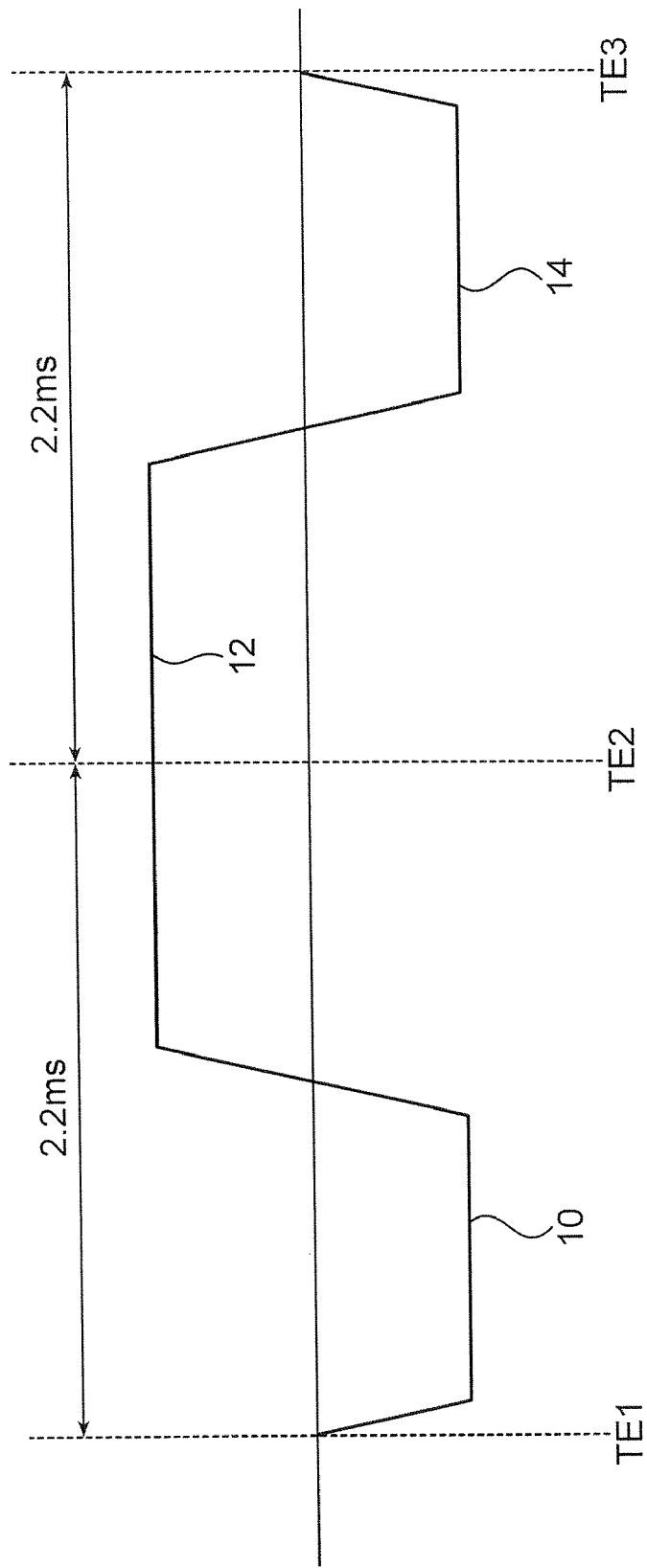
FIG. 1 is a simplified sequence diagram of a total sampling time (TST) acquisition according to an embodiment of the invention.

Turning now to FIG. 1, a suitable pulse sequence for acquisition of MRI data from a scanned object region according to an embodiment will be described. In this embodiment, a read gradient of a continuously sampled rectilinear fast low-angle shot (FLASH) pulse sequence is shown with a time between echoes at TE1, TE2 and TE3 set at 2.2 ms providing a ΔTE at 2.2 milliseconds at 1.5 T, to take advantage of the chemical shift between water and fat. FIG. 1 shows the read gradient, $G_{Read}$ with the timing between the start of the applied gradient and the echoes set to 2.2 milliseconds in this example. The read gradient includes a dephase period 10, along with a readout period 12 and a rephase period 14. The use of total sampling time (TST) acquisition is performed during the entire read gradient, such that data from the dephase lobe 10, and rephase lobe 14 are combined and used as a first Dixon data set, while data from the readout lobe 12 is used as a second Dixon data set. It is assumed that both components of water and fat are in the image, and the combined image at an echo time $T_{E,i}$ is set forth by the following equation:

$$M_i = m_\omega + e^{-i\omega_f T_{E,i}} m_f \qquad \text{Equation 1}$$

where $m_w$ is the image of the water component and $m_f$ is the image of the fat component. $T_{E,i}$ is chosen based upon water resonance, so only the lipid component processes at $\omega_f$, set forth as:

$$\omega_f T_{E,i} = 0, \pi \bmod 2\pi \qquad \text{Equation 2}$$

such that the two resulting images may be set forth as:

$$m_1 = m_\omega + m_f \qquad \text{Equation 3}$$

$$m_2 = m_\omega - m_f \qquad \text{Equation 4}$$

which then can be combined to make images containing only water or only fat, set forth as:

$$m_\omega = 1[m_1 + m_2] \qquad \text{Equation 5}$$

$$m_f = 1[m_1 - m_2] \qquad \text{Equation 6}$$

Optionally, further improvement in image quality may be provided by off-resonance correction or echo alignment techniques for example.

As an example of an embodiment of the present invention, a pulse sequence to acquire k-space data may be a multislice gradient echo sequence, such as a fast low angle shot sequence (FLASH). Such a sequence at a magnetic field strength of 1.5 T, may utilize TR values which range from 10-100 ms for example, while utilizing TE values of 3 to 50 ms and flip angles of between 10 to 70 degrees as examples. Other parameters may be used if desired. The pulse sequence may utilize a spoiler gradient after the echo to spoil the steady state by causing a spatially dependent phase shift. This technique spoils the transverse steady state but there is still a longitudinal steady state that depends upon the T1 values and the flip angle. In accordance with this embodiment, the TR, TE and flip angle can be manipulated in a desired manner to generate suitable image data. TR may be varied, with nominal effects on contrast as long as the RF pulse is properly chosen. Longer TR's will generally result in higher signal to noise, but with longer scan time. As TR is decreased the optimal flip angle becomes smaller. The TE determines the degree of T2* and sensitivity to motion. The TE is generally chosen to be as short as possible. The flip angle is generally chosen to provide desired contrast characteristics. Smaller flip angles may be chosen to provide weighted images. Larger flip angles produce more T1 weighting. A 90 degree flip produces a heavily T1 weighted image but decreases signal. Other gradient echo sequences may also be used according to the invention, such as true-FISP, FISP, GRASS, SPGR or others in a similar manner. The gradient echo sequences show a wide range of variations compared to the spin echo and inversion recovery sequences. Not only is the basic sequence varied by adding dephasing or rephasing gradients at the end of the sequence, but there is a significant extra variable to specify in addition to things like the TR and TE. This variable is the flip or tip angle of the spins. The flip angle is usually at or close to 90 degrees for a spin echo sequence but commonly varies over a range of about 10 to 80 degrees with gradient echo sequences. For the gradient echo sequence FLASH, the larger tip angles give more T1 weighting to the image and the smaller tip angle give more T2 or actually T2* weighting to the images.

Using a gradient echo sequence, the spins are generally refocused by reversing the direction of the spins rather than flipping them over to the other side of the x-y plane as occurs with a spin echo sequence. Gradient refocusing of the spins takes considerably less time than 180 degree RF pulse refocusing.

In the example of using a rectilinearly FLASH pulse sequence, as shown in the embodiment of FIG. 1, the sequence utilizes TE's which are selected to allow 180° phase variation in the fat magnetization between each of the three TE's, being TE1, TE2 and TE3 with the time between echoes at 2.2 milliseconds. A spoiler gradient is utilized to spoil the transverse magnetization created by the FLASH magnetization cycle in a known manner. As is known, the spoiler magnetic field gradient pulse is applied to effectively remove transverse magnetization by producing a rapid variation of its phase along the direction of the gradient. This is done after the echo, so that transverse magnetization is destroyed before the next excitation pulse, and "spoils" any remaining xy-magnetization or refocuses the xy-magnetization.

The use of FLASH imaging reduces the flip angle and thereby reduces the dependence of the signal on T1 while the use of total sampling time (TST) acquisition allows use of Dixon fat suppression in a single acquisition. This provides significant improvement over traditional two-point Dixon methods in terms of time savings, while providing required suppression of fat or water signals. Accomplishing fat suppression in one TST acquisition results in significant reductions in acquisition times as compared to traditional two-point Dixon methods or as compared to dual-echo Dixon acquisitions.

In the present invention, the total sampling time acquisition may utilize a sampling sequence in which sampling is performed during the constant part of a readout gradient lobe, resulting in equidistant sampling of each k-space area. The invention utilizes additional acquisition of k-space data in the dephase and rephase portions of the sampling sequence as an example, to thereby extend the acquisition window during the sampling sequence. As will be set forth according to an embodiment of the invention, the acquisition cycle is extended over the entire positive readout gradient, and further extends the acquisition window to include the negative dephase (or prephaser) portion of the sequence, as well as the rephase portion to allow sampling of additional k-space data. In such an approach, the sloped portions of the primary readout gradient lobe, as well as the sloped portions of the dephase/rephase lobes result in non-equidistant sampling of each k-space phase encode line, which is then accounted for during image reconstruction. In this manner, data is acquired during the entire sequence to enable significant shortening of the data acquisition time relating to the use of Dixon techniques for forming chemical species suppression, which in this example may be water/fat separated images. Image reconstruction may use suitable regridding techniques on the k-space data prior to Fourier transform, and additional corrections for reconstruction may be used as desired, such as phase or offset correction.

Figure 2:
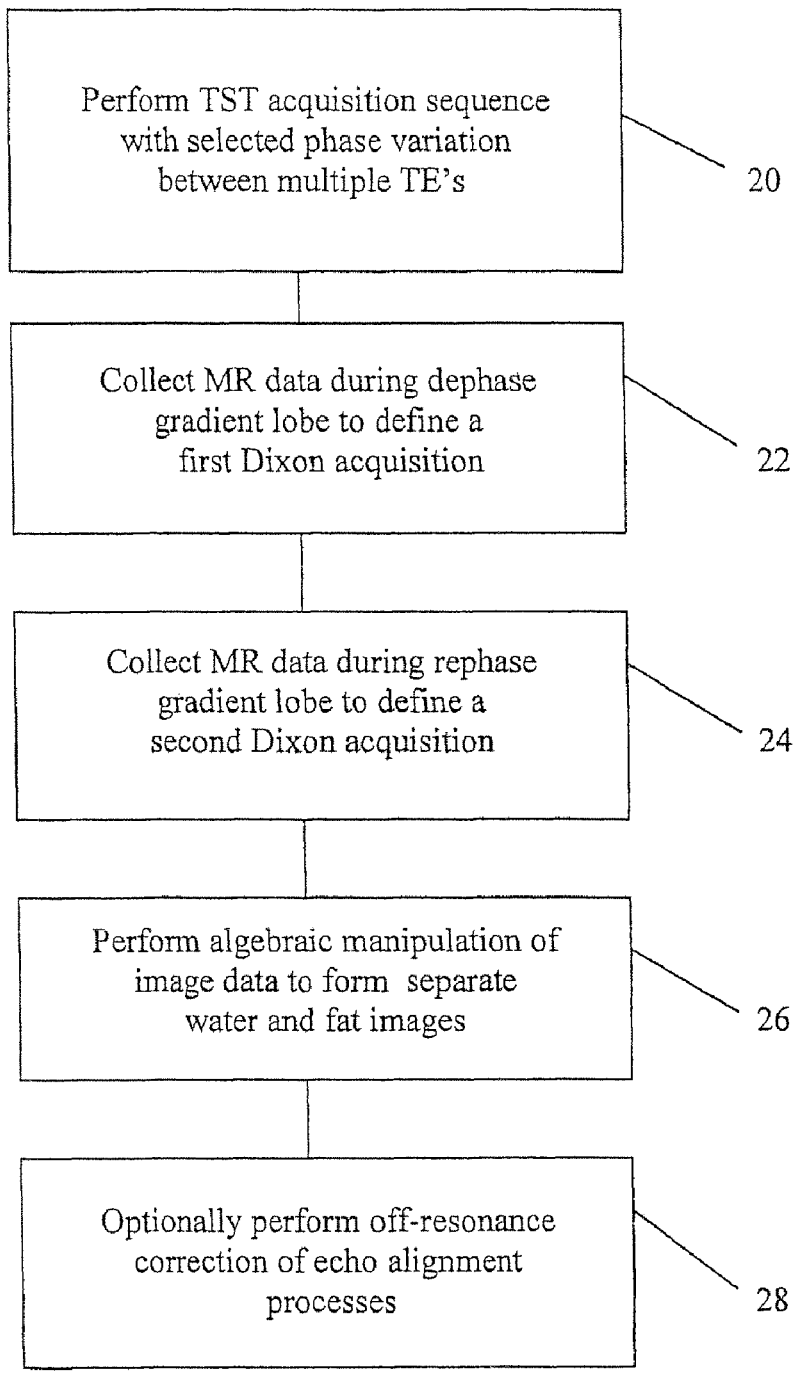
FIG. 2 is a flow chart of an embodiment of the method according to the invention.

Turning to FIG. 2, a method according to the invention is depicted, wherein a first step at 20 is to perform a TST acquisition sequence with selected phase variation between multiple TE's. Although the ΔTE of 2.2 milliseconds shown in FIG. 1 demonstrates a simple form of the TST acquisition, this interval is not fixed and other ΔTE's are contemplated, which could further reduce total acquisition time based upon the method. At 22, MR data is collected during the dephase gradient lobe, the gradient readout lobe and rephase lobe of the pulse sequence. At 24, the collected MR data during the dephase and rephase gradient lobes is combined to form a first Dixon acquisition, with MR data collected during the readout gradient lobe of the pulse sequence forms a second Dixon acquisition. At 26, algebraic manipulation of the image data is performed to form separate water and fat images. At 28, techniques for improving image quality may be optionally performed, such as off-resonance correction or spin echo alignment techniques.

EXAMPLES

FIGS. 3A-3C and 4A-4C show the results according to use of the methods of the invention as compared to typical two-point Dixon methods. As a particular example, a FLASH pulse sequence according to FIG. 1 was implemented on a 1.5T Siemens Sonata MR Scanner, with TE1, TE2 and TE3 selected to allow 180° phase variation in the fat magnetization between each of the three TE's. Imaging parameters used were TE1/TE2/TE3=3.4/5.6/7.8 milliseconds, TR=14 milliseconds, FOV=300 millimeter$^2$, slice thickness=5 millimeters. A second acquisition was collected with TE2=7.8 milliseconds in order to perform traditional, two-point Dixon fat suppression for comparison. Phantom and clinical images were acquired with the TST sequence of FIG. 1, with the dephase/rephase ($S_1$) and readout ($S_2$) k-space data gridded separately using linear interpolation from a measured trajectory. The water and fat images were calculated by adding or subtracting $S_1$ and $S_2$ and then performing 2D Fast Fourier Transform (2DFFT) to image space. Off-resonance correction or other correction techniques can be applied as desired to the image data.

With respect to the formed images, the contrast-to-noise ratio (CNR) was measured to quantify the level of fat suppression. As an example, CNR is calculated according to the following equation:

$$CNR = (I_{water} + I_{fat})/\sigma_{background},$$

where $I_{water}$ and $I_{fat}$ are mean signal amplitudes of the water and fat respectively, using a selected region of interest in the image data, and $\sigma_{background}$ is the standard deviation of the background signal.

Figure 3A:
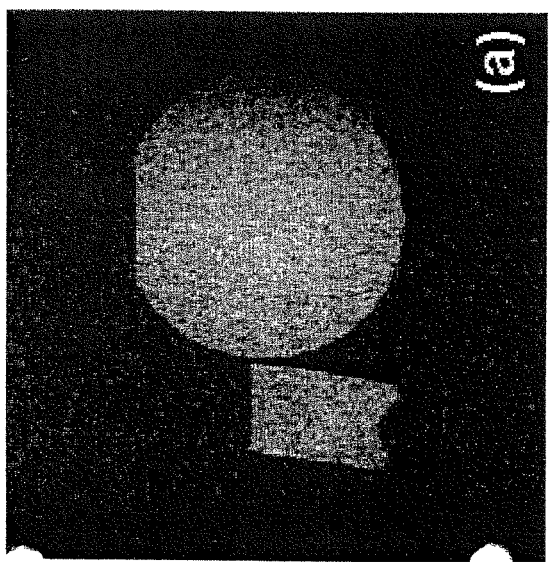
FIGS. 3A-C are phantom images, with FIG. 3A being a traditional MRI image without suppression as a reference, FIG. 3B being a traditional, 2-point, 2-acquisition Dixon image, and FIG. 3C being an MRI image using the method according to an embodiment of the present invention.
Figure 3B:
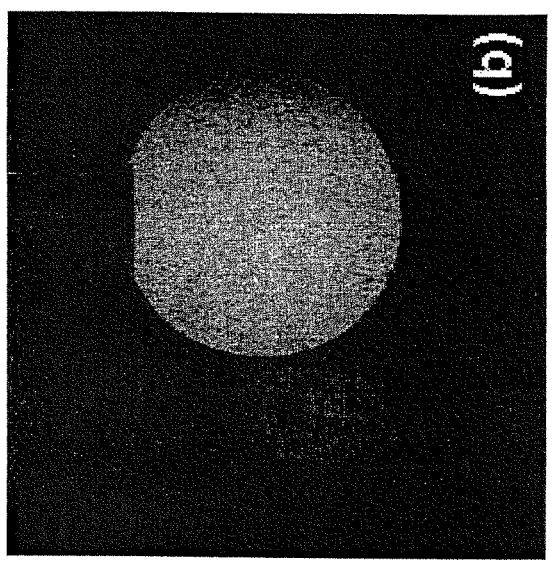
Figure 3C:
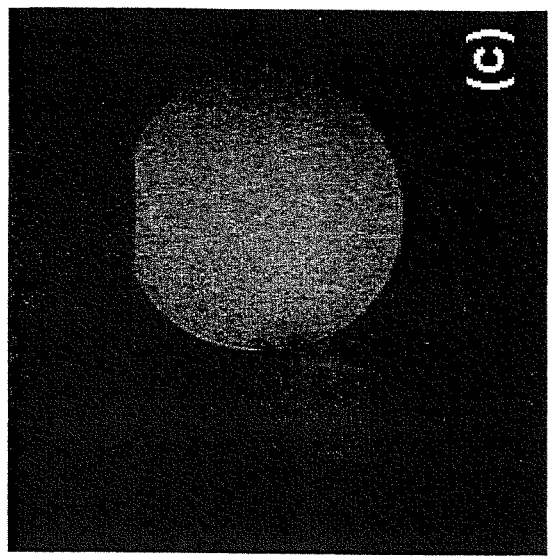

FIG. 3A shows a phantom image of a standard round water phantom and a bottle of mineral oil. This figure is a traditional image without suppression and is used as a reference relative to FIGS. 3B and 3C, wherein FIG. 3B shows a phantom image using a typical, two-point, two-acquisition Dixon method. FIG. 3C shows the results of the present invention, wherein the continuously sampled, two-point, one-acquisition Dixon phantom image is shown. As is evident from a review of FIGS. 3B and 3C, the use of a TST acquisition sequence provides desired Dixon fat/water separation, while reducing acquisition time approximately in half. In calculating CNR for these images, the CNR for the water images shown in FIGS. 3B and 3C were 8.6 and 8.7 respectively. Similarly, as shown in FIGS. 4A-4C, an in-vivo head image is shown with FIG. 4A showing the traditional image without suppression as referenced. A traditional, two-point, two-acquisition Dixon image is shown in FIG. 4B, while the continuously sampled, two-point, one-acquisition Dixon image according to the method of the present invention is shown in FIG. 4C. In calculating CNR for the water images produced were 30.4 and 28.0 for FIGS. 4B and 4C respectively. In the images shown in FIGS. 3 and 4, the images are not corrected for off-resonance as for these particular cases, images before and after correction were virtually identical.

The use of a TST acquisition provides Dixon fat suppression in a single acquisition to substantially reduce acquisition time. The results of the systems and methods show nearly identical suppression of fat or water as compared to typical 2 point Dixon methods. Selection of reduced ΔTE's may also provide reduction of total acquisition times while achieving desired suppression of fat or water.

Figure 5:
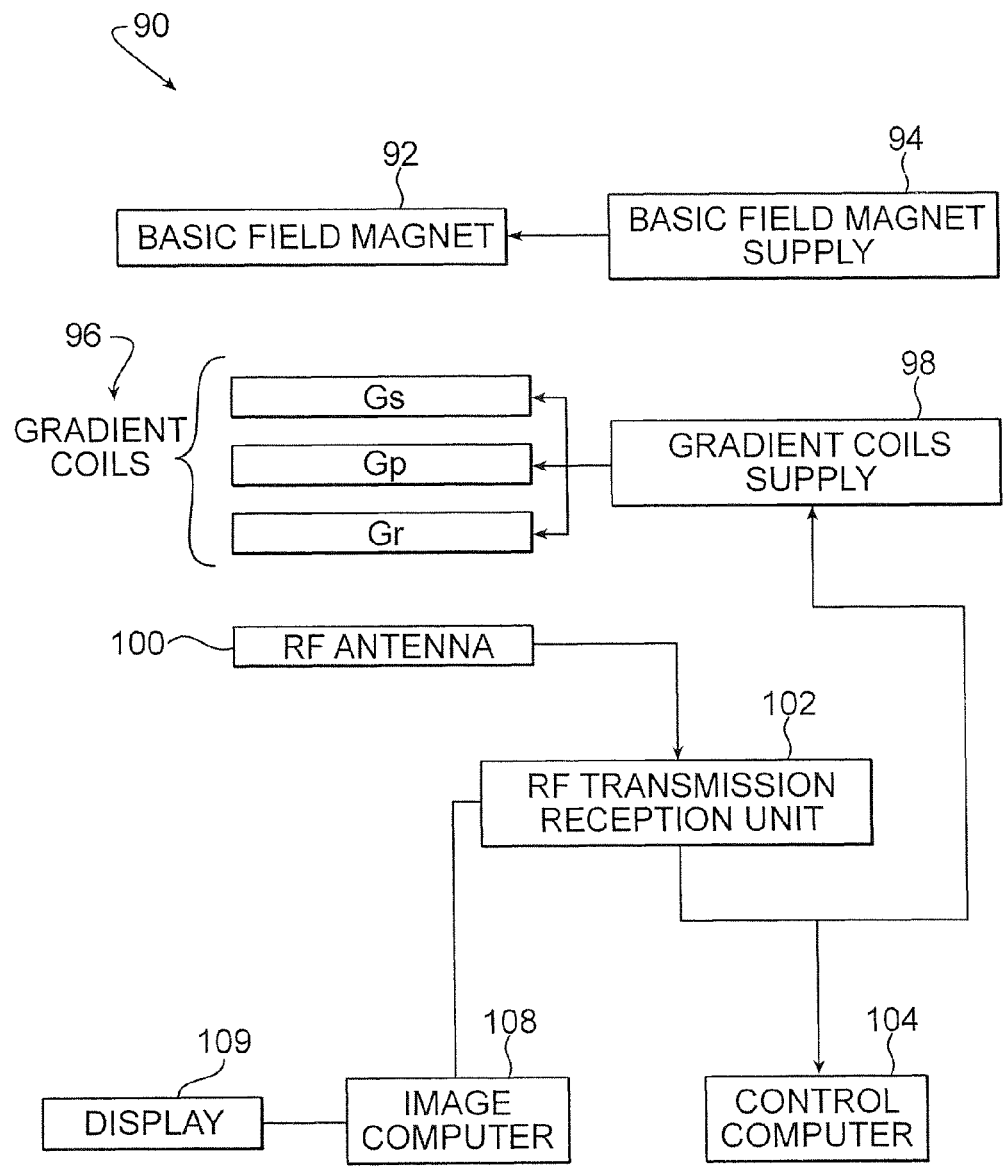
FIG. 5 shows a MRI system for acquiring MRI data according to an embodiment of the invention.

FIG. 5 illustrates one example of a magnetic resonance system 90 of the type that can be used with the systems and methods described above. Other MRI systems are known to those skilled in the art, and are contemplated according to the invention. The system 90 includes a basic field magnet 92 supplied by a basic field magnet supply 94. The system has gradient coils 96 for respectively generating gradient magnetic fields $G_s$, $G_p$ and $G_r$, operated by gradient coil supply 98. An RF antenna 100 is provided for generating RF pulses, and for receiving resulting magnetic resonance signals from an object being imaged. The RF antenna 100 is operated by an RF transmission/reception unit 102. The RF antenna 100 may be employed for transmitting and receiving, or alternatively, separate coils may be provided for transmitting and receiving if desired. The gradient coil supply 98 and the RF transmission/reception unit 102 may be operated by a control system 104 to selectively produce radio frequency signal pulses directed to the object to be imaged, and to generate gradient magnetic fields for localizing a region of resonance. The magnetic resonance signals received by the RF antenna are processed into image data, such as by 2D Fast Fourier Transform (2DFFT) such as by an image computer 108 or other suitable processing system. The image data may then be shown on a display 109. According to the present invention, the MRI apparatus is operated and acquires MR data according to the TST acquisition as described.

Although various embodiments of the present invention have been shown and described herein, various changes and modifications would occur to those skilled in the art without departing from the scope of the invention. Therefore, the appending claims encompass within their scope all such changes and modifications, and are not to be limited thereby.

The invention claimed is:

1. An apparatus, comprising:
   an MRI scanner for obtaining images of a predetermined volume;
   a controller configured to control operation of the scanner to acquire images using a modified Dixon technique where data acquisition for the modified Dixon technique is performed over a readout lobe and one or more of, a dephase lobe, and a rephase lobe of a gradient echo pulse sequence performed by the scanner;
   where data acquired during one or more of the dephase and rephase lobes form a first Dixon MRI data set and data acquired during the readout lobe is used to form a second Dixon MRI data set;
   a processing system to process the first Dixon MRI data set and the second Dixon MRI data set using a Dixon reconstruction technique to create a first chemical species image data set and a second chemical species image data set, and
   an output device for displaying a first chemical species image and a second chemical species image, based, at least in part, on the first and second chemical species image data sets.

2. The apparatus of claim 1, where the gradient echo pulse sequence is selected from the group consisting of a FLASH sequence, a true-FISP sequence, a FISP sequence, a GRASS sequence, and a SPGR.

3. The apparatus of claim 1, where the gradient echo pulse sequence uses TR values ranging from 10-100 ms, TE values ranging from 3 to 50 ms, and flip angles of between 10 to 70 degrees.

4. The apparatus of claim 3, where the TE values are chosen to allow 180 degree phase variation between the first and second chemical species magnetization between each TE.

5. The apparatus of claim 1, where the MRI scanner acquires k-space data at a first TE, a second TE, and a third TE to acquire signal components from a first chemical species and from a second chemical species at the TE times.

6. The apparatus of claim 1, where the processing system performs an off resonance correction method to suppress the effects of local magnetic field inhomogeneity on the first chemical species image data set.

7. The apparatus of claim 1, where the processing system performs an off resonance correction method to suppress the effects of local magnetic field inhomogeneity on the second chemical species image data set.

8. The apparatus of claim 1, where the first chemical species is water and the second chemical species is fat.

9. The apparatus of claim 1, where the first and second Dixon MRI data sets are processed using a 2-point Dixon reconstruction technique.

10. A method, comprising:
    acquiring k-space data over the read gradient and one or more of a dephase lobe and a rephase lobe of a gradient echo pulse sequence;
    forming a first Dixon acquisition from k-space data from one or more of the dephase and rephase lobes of the gradient echo pulse sequence and forming a second Dixon acquisition from k-space data from the readout lobe; and
    forming first and second chemical species images from the first and second Dixon acquisitions using a Dixon reconstruction technique.

11. The method of claim 10, where the gradient echo pulse sequence is selected from the group consisting of a FLASH sequence, a true-FISP sequence, a FISP sequence, a GRASS sequence and a SPGR.

12. The method of claim 11, where the FLASH sequence uses TR values ranging from 10-100 ms, TE values ranging from 3 to 50 ms, and flip angles of between 10 to 70 degrees.

13. The method of claim 12, where the TE values are chosen to allow 180 degree phase variation between the first and second chemical species magnetization between each TE.

14. The method of claim 11, where acquiring k-space data is performed by the MRI scanner at a first TE, a second TE, and a third TE to acquire signal components from both the first and second chemical species at each of the TE times.

15. The method of claim 11, comprising:
    performing an off resonance correction method to suppress the effects of local magnetic field inhomogeneity on the first chemical species image data set.

16. The method of claim 11, comprising:
    performing an off resonance correction method to suppress the effects of local magnetic field inhomogeneity on the second chemical species image data set.

17. The method of claim 10, where the gradient echo pulse sequence uses TR values ranging from 10-100 ms, TE values ranging from 3 to 50 ms, and flip angles of between 10 to 70 degrees.

18. The method of claim 10, where the gradient echo pulse sequence is a FLASH sequence using three TE values in the pulse sequence, with a time between echoes selected to be 2.2 milliseconds, for purposes of performing two-point Dixon processing, where each TE is a multiple of 2.2 milliseconds.

19. The method of claim 18, where three TE values are used in the pulse sequence comprising a first TE of 3.4 milliseconds, a second TE of 5.6 milliseconds, and a third TE of 7.8 milliseconds.

20. An apparatus, comprising:
a MRI scanner for obtaining images of a predetermined volume;
a controller configured to control operation of the scanner to acquire images using a modified Dixon technique where data acquisition is performed over a read gradient and one of a dephase pulse and a rephase pulse of a gradient echo pulse sequence performed by the scanner to produce a plurality of magnetic resonance imaging data signals;
a processing system to process the plurality of MRI data signals using a Dixon reconstruction technique to create a first chemical species image data set and a second chemical species image data set, and
an output device for display of a first chemical species image and a second chemical species image;
where the gradient echo pulse sequence uses TR values ranging from 10-100 ms, TE values ranging from 3 to 50 ms, and flip angles of between 10 to 70 degrees;
where the TE values are chosen to allow 180 degree phase variation between the first and second chemical species magnetization between each TE; and
where a FLASH sequence is used with three TE values used in the pulse sequence, with a time between echoes selected to be 2.2 milliseconds, for purposes of performing two-point Dixon processing, where each TE is a multiple of 2.2 milliseconds.

21. An apparatus, comprising:
an MRI scanner for obtaining images of a predetermined volume;
a controller configured to control operation of the scanner to acquire images using a modified Dixon technique where data acquisition is performed over a read gradient and one or more of a dephase pulse and rephase pulse of a gradient echo pulse sequence performed by the scanner to produce a plurality of magnetic resonance imaging data signals;
a processing system to process the plurality of MRI data signals using a Dixon reconstruction technique to create a first chemical species image data set and a second chemical species image data set, and
an output device for display of a first chemical species image and a second chemical species image;
where the gradient echo pulse sequence uses TR values ranging from 10-100 ms, TE values ranging from 3 to 50 ms, and flip angles of between 10 to 70 degrees;
where the TE values are chosen to allow 180 degree phase variation between the first and second chemical species magnetization between each TE;
where a FLASH sequence is used with three TE values used in the pulse sequence, with a time between echoes selected to be 2.2 milliseconds, for purposes of performing two-point Dixon processing, where each TE is a multiple of 2.2 milliseconds; and
where three TE values comprise a first TE of 3.4 milliseconds, a second TE of 5.6 milliseconds, and a third TE of 7.8 milliseconds is used in the pulse sequence.

* * * * *